(12) United States Patent
Yue et al.

(10) Patent No.: US 12,471,471 B2
(45) Date of Patent: Nov. 11, 2025

(54) DISPLAY PANEL AND DRIVING METHOD THEREFOR, AND DISPLAY APPARATUS

(71) Applicant: BOE Technology Group Co., Ltd., Beijing (CN)

(72) Inventors: Han Yue, Beijing (CN); Can Zhang, Beijing (CN); Minghua Xuan, Beijing (CN); Xiaochuan Chen, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 785 days.

(21) Appl. No.: 17/756,608

(22) PCT Filed: Jan. 19, 2021

(86) PCT No.: PCT/CN2021/072716
§ 371 (c)(1),
(2) Date: May 27, 2022

(87) PCT Pub. No.: WO2021/147862
PCT Pub. Date: Jul. 29, 2021

(65) Prior Publication Data
US 2022/0415976 A1     Dec. 29, 2022

(30) Foreign Application Priority Data
Jan. 21, 2020   (CN) .......................... 202010070780.2

(51) Int. Cl.
*H01L 27/32* (2006.01)
*H10K 59/131* (2023.01)
(Continued)

(52) U.S. Cl.
CPC .......... *H10K 59/35* (2023.02); *H10K 59/131* (2023.02); *H10K 59/353* (2023.02); *H10K 59/80518* (2023.02)

(58) Field of Classification Search
CPC .... H10K 59/35; H10K 50/818; H10K 59/131; H10K 59/353; H10K 59/80518; H10K 2102/3026; G09G 3/3208
See application file for complete search history.

(56) References Cited

U.S. PATENT DOCUMENTS

2009/0046041 A1* 2/2009 Tanikame ............ H10K 59/131
                                                                345/76
2012/0187425 A1   7/2012 Omoto
2018/0151631 A1   5/2018 Lee et al.

FOREIGN PATENT DOCUMENTS

CN        102623485 A    8/2012
CN        108122943 A    6/2018
(Continued)

OTHER PUBLICATIONS

Chinese Office Action, mailed Apr. 15, 2022, from Chinese patent application No. 202010070780.2.
(Continued)

*Primary Examiner* — Elmito Breval
(74) *Attorney, Agent, or Firm* — Workman Nydegger

(57) ABSTRACT

A display panel includes: a base substrate, light-emitting devices on the base substrate, and barrier structures. The light-emitting device includes: a first electrode and a second electrode arranged in a stacked manner, and a light-emitting functional layer between the first electrode and the second electrode. The barrier structures are located on a film layer between the light-emitting functional layer and the base substrate. The orthographic projection of the barrier structure on the base substrate is between the orthographic projections of adjacent light-emitting devices on the base substrate. The barrier structure is configured to generate, under the control of an electrical signal, an electric field in a direction perpendicular to a plane where the base substrate is located.

13 Claims, 6 Drawing Sheets

(51) Int. Cl.
*H10K 59/35* (2023.01)
*H10K 59/80* (2023.01)

(56) References Cited

FOREIGN PATENT DOCUMENTS

| | | |
|---|---|---|
| CN | 110190105 A | 8/2019 |
| CN | 111261794 A | 6/2020 |
| JP | 2014052582 A | 3/2014 |
| JP | 2014197466 A | 10/2014 |

OTHER PUBLICATIONS

Chinese Office Action, mailed Feb. 24, 2022, from Chinese patent application No. 202010070780.2.
International Search Report and Written Opinion, mailed Apr. 9, 2021, from PCT/CN2021/072716.

* cited by examiner

-- Prior Art --

Load an electrical signal to a barrier structure, so as to control the barrier structure to generate an electric field in a direction perpendicular to a plane where a base substrate is located, so that carriers in a light-emitting functional layer move in the direction perpendicular to the plane where the base substrate is located under an action of the electric field ⟶ S101

Fig. 12

DISPLAY PANEL AND DRIVING METHOD THEREFOR, AND DISPLAY APPARATUS

CROSS REFERENCE TO RELATED APPLICATIONS

The present application is a national phase entry under 35 U.S.C. § 371 of International Application No. PCT/CN2021/072716, filed on Jan. 19, 2021, which claims priority to Chinese Patent Application No. 202010070780.2, entitled "DISPLAY PANEL AND DRIVING METHOD THEREFOR, AND DISPLAY APPARATUS", and filed to the China National Intellectual Property Administration on Jan. 21, 2020, the entire contents of which are incorporated herein by reference.

FIELD

The present disclosure relates to the technical field of display, in particular to a display panel and a driving method therefor, and a display apparatus.

BACKGROUND

An organic light emitting diode (OLED) display panel has attracted extensive attention due to its advantages of self-luminescence, fast response, wide viewing angle, high brightness, bright color, light, thinness and the like.

In an OLED display panel, a light-emitting functional layer and a color film layer are usually used to realize luminescence of a red sub-pixel, a green sub-pixel and a blue sub-pixel. Each sub-pixel in the display panel shares the light-emitting functional layer. The light-emitting functional layer may include: organic layers such as a hole injection layer (HIL), a hole transport layer (HTL), an electron transport layer (ETL) and an emission layer (EL). There are many carriers in some organic layers, the carriers can move laterally along the organic layers, thereby enhancing the lateral conductivity of the organic layers, resulting in lateral crosstalk among the sub-pixels. For example, when there is a current in a sub-pixel, the organic layer with strong lateral conductivity can conduct the carriers to adjacent sub-pixels, and thus affecting the luminescence of the adjacent sub-pixels and the display effect.

SUMMARY

A display panel provided by embodiments of the present disclosure includes:
  a base substrate;
  a plurality of light-emitting devices, located on the base substrate, wherein each light-emitting device includes: a first electrode and a second electrode arranged in a stacked manner, and a light-emitting functional layer located between the first electrode and the second electrode.
  barrier structures, located on a film layer between the light-emitting functional layer and the base substrate, wherein an orthographic projection of the barrier structure on the base substrate is located between orthographic projections of light-emitting devices, adjacent to the barrier structure, on the base substrate.
  The barrier structure is configured to generate, under control of an electrical signal, an electric field in a direction perpendicular to a plane where the barrier structure is located.

Optionally, in the embodiments of the present disclosure, the barrier structure includes: a dielectric layer and a conductive layer arranged in a stacked manner. The dielectric layer is located between the conductive layer and the light-emitting functional layer.

Optionally, in the embodiments of the present disclosure, the first electrodes of the plurality of light-emitting devices are arranged separately.

The conductive layer is arranged on a same layer as at least one film layer in the first electrode. The orthographic projection of the barrier structure on the base substrate does not overlap an orthographic projection of the first electrode on the base substrate.

Optionally, in the embodiments of the present disclosure, the first electrode includes a first conductive electrode, a metal reflective layer and a second conductive electrode sequentially away from the base substrate.

The conductive layer is arranged on the same layer as the first conductive electrode.

Optionally, in the embodiments of the present disclosure, the barrier structure is a ring-shaped structure surrounding the light-emitting device.

Optionally, in the embodiments of the present disclosure, each barrier structure surrounds a respective one of the light-emitting devices, and each light-emitting device is surrounded by a respective one of the barrier structures in the display panel.

Optionally, in the embodiments of the present disclosure, the plurality of light-emitting devices are arranged in an array in a first direction and a second direction, and the first direction and the second direction intersect with each other.

In the first direction, two adjacent barrier structures are separated by at least one light-emitting device.

Optionally, in the embodiments of the present disclosure, in a row of light-emitting devices arranged in the second direction, each light-emitting device is surrounded by a respective one of the barrier structures.

Optionally, in the embodiments of the present disclosure, in the second direction, two adjacent barrier structures are separated by at least one light-emitting device.

Optionally, in the embodiments of the present disclosure, a surface of a side of the dielectric layer close to the light-emitting functional layer has surface defects.

Optionally, in the embodiments of the present disclosure, a material of the dielectric layer includes at least one of silicon dioxide or silicon nitride.

Optionally, in the embodiments of the present disclosure, the display panel further includes: a power signal line.

The power signal line is coupled with the conductive layer, and configured to provide the electrical signal to the conductive layer.

Accordingly, embodiments of the present disclosure further provide a display apparatus, including any one of the above display panels.

Accordingly, embodiments of the present disclosure further provide a driving method for the above display panel, including:
  loading the electrical signal to the barrier structure, so as to control the barrier structure to generate the electric field in the direction perpendicular to the plane where the base substrate is located, so that carriers in the light-emitting functional layer move in the direction perpendicular to the plane where the base substrate is located under an action of the electric field.

BRIEF DESCRIPTION OF THE DRAWINGS

FIG. 12 is a flow chart of a driving method for a display panel provided by an embodiment of the present disclosure.

DETAILED DESCRIPTION OF THE EMBODIMENTS

In order to make the purpose, technical solutions and advantages of the embodiments of the present disclosure clearer, the technical solutions of the embodiments of the present disclosure will be clearly and completely described below with reference to the accompanying drawings of the embodiments of the present disclosure. Obviously, the described embodiments are some, but not all, embodiments of the present disclosure. Moreover, without conflict, the embodiments in the present disclosure and the features in the embodiments can be combined with each other. Based on the embodiments in the present disclosure, all other embodiments acquired by those of ordinary skill in the art without creative work shall fall within the protection scope of the present disclosure.

Unless otherwise defined, technical or scientific terms used herein should have the ordinary meaning as understood by one of ordinary skill in the art to which this disclosure belongs. The terms "first", "second" and the like used in the present disclosure do not denote any order, quantity or importance, but are only used to distinguish different components. "Comprise" or "include" and similar words mean that the elements or objects appearing before the word encompass the elements or objects recited after the word and their equivalents, but do not exclude other elements or objects. Similar words such as "connect" or "link" are not limited to physical or mechanical connection, but may include electrical connection, whether direct or indirect.

It should be noted that the sizes and shapes of various patterns in the accompanying drawings do not reflect the true ratio, and are only intended to illustrate the content of the present disclosure schematically. In addition, the same or similar numerals refer to the same or similar elements or elements having the same or similar functions throughout.

Figure 1:
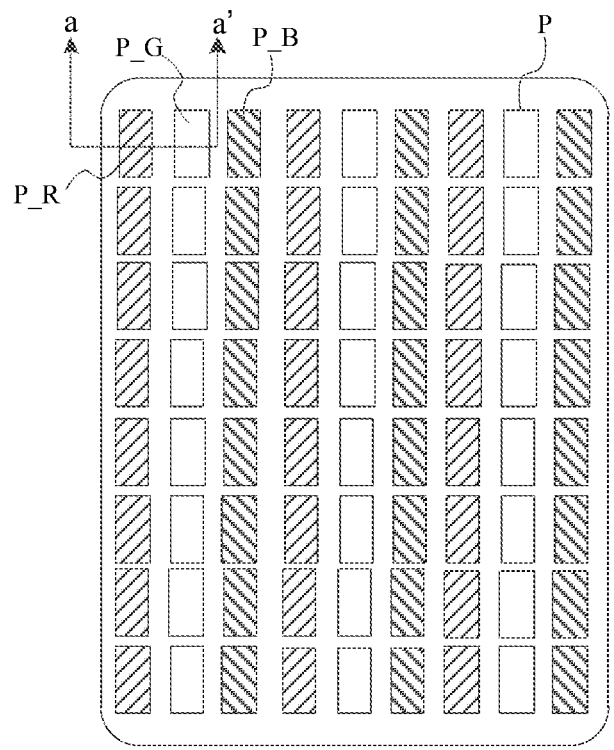
FIG. 1 is a schematic top view of a display panel in the related art.
Figure 2:
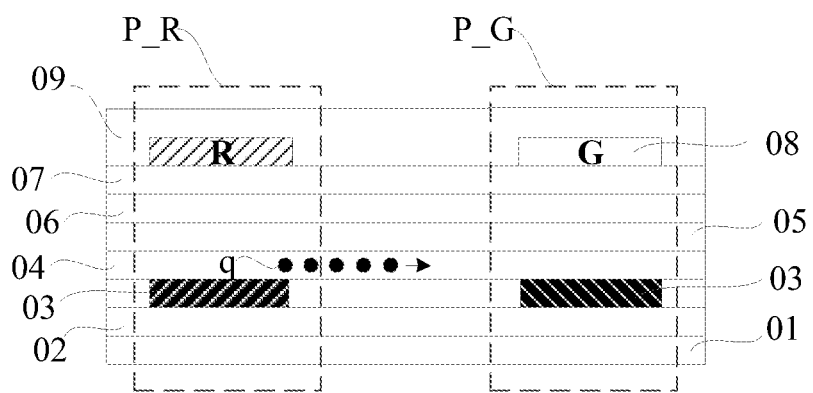
FIG. 2 is a schematic sectional view of the display panel along a dotted line aa' in FIG. 1.

FIG. 1 is a schematic top view of a display panel in the related art. As shown in FIG. 1, the display panel may include a plurality of sub-pixels P. In order to realize color display, the plurality of sub-pixels P in the display panel may be divided into: a red sub-pixel P_R, a green sub-pixel P_G and a blue sub-pixel P_B. FIG. 2 is a schematic sectional view of the display panel along a dotted line aa' in FIG. 1. With reference to FIG. 1 and FIG. 2, the display panel may include: a substrate 01, a driving film layer 02 on the substrate 01, an anode 03 on a side of the driving film layer 02 facing away from the substrate 01, a cathode 07 on a side of the anode 03 facing away from the substrate 01, a light-emitting functional layer between the anode 03 and the cathode 07, a color film layer 08 on a side of the cathode 07 facing away from the substrate 01, and an encapsulation layer 09 on a side of the color film layer 08 facing away from the substrate 01. The light-emitting functional layer may include: a hole injection layer 04 on the anode 03, an emission layer 05 on the hole injection layer 04, and an electron transport layer 06 on the emission layer 05. The color film layer 08 may include: a red (R) filter part, a green (G) filter part and a blue filter part (not shown in FIG. 2). The light-emitting functional layer may emit white light. After the light emitted by the emission layer passing through the color film layer 08, light of different colors may be emitted, so as to realize color display. The plurality of sub-pixels in the display panel share the light-emitting functional layer, that is, the light-emitting functional layer is arranged as a whole layer. Moreover, there are many carriers in some organic layers, lateral crosstalk among the sub-pixels is prone to occurring. For example, in FIG. 2, assume the red sub-pixel P_R needs to be lit, and the green sub-pixel P_G does not need to be lit, since there are many carriers q in the hole injection layer 04, the carriers q are likely to move into the adjacent green sub-pixel P_R along the hole injection layer 04, namely causing lateral conductivity, resulting in that the green sub-pixel P_G which should not be luminous is lit, color crosstalk is caused, and consequently, the display effect of the display panel is affected.

Figure 3:
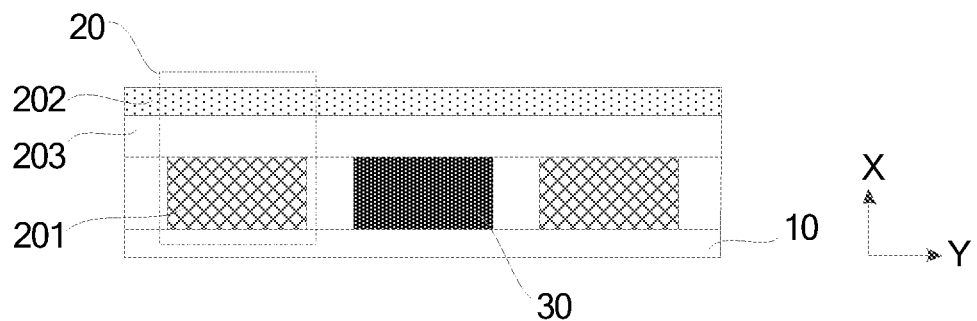
FIG. 3 is a schematic sectional view of a display panel provided by an embodiment of the present disclosure.

In view of this, embodiments of the present disclosure provide a display panel and a driving method therefor, and a display apparatus. FIG. 3 is a schematic sectional view of a display panel in an embodiment of the present disclosure. As shown in FIG. 3, the display panel may include a base substrate 10, a plurality of light-emitting devices 20, and a barrier structure 30.

In an implementation process, the base substrate 10 may be a silicon substrate or a glass substrate. Those skilled in the art can select the base substrate 10 of corresponding material according to actual needs, which is not limited here.

The plurality of light-emitting devices 20 are located on the base substrate 10. Each light-emitting device 20 may include: a first electrode 201 and a second electrode 202 arranged in a stacked manner, and a light-emitting functional layer 203 located between the first electrode 201 and the second electrode 202. In some embodiments of the present disclosure, the first electrode is an anode, and the second electrode is a cathode; or the first electrode is a cathode, and the second electrode is an anode, which is not limited here. The light-emitting functional layer 203 may include organic layers such as a hole injection layer, a hole transport layer, an emission layer and an electron transport layer, or may include other organic layers, which is not limited here.

The barrier structure 30 is located between the light-emitting functional layer 203 and the base substrate 10. An orthographic projection of the barrier structure 30 on the base substrate 10 is located between orthographic projections of adjacent light-emitting devices 20 on the base substrate 10.

The barrier structure 30 is configured to generate, under the control of an electrical signal, an electric field perpendicular to the base substrate 10.

In embodiments of the present disclosure, the display panel may include a plurality of sub-pixels. The plurality of sub-pixels may be divided into red sub-pixels, green sub-pixels and blue sub-pixels. One light-emitting device 20 is arranged in each sub-pixel. The light-emitting devices 20 in the display panel may share the light-emitting functional layer 203. Each organic layer in the light-emitting functional layer 203 is arranged as a whole layer. In implementations, a color film layer may be arranged on a light emitting side of the light-emitting functional layer 203. The light-emitting functional layer may emit white light. After light emitted by the emission layer passing the color film layer, light of different colors can be emitted, thereby realizing color display.

In the display panel provided by the embodiments of the present disclosure, the barrier structure 30 is arranged between adjacent light-emitting devices 20. The barrier structure 30 can generate the electric field in a direction perpendicular to a plane where the base substrate 10 is located after receiving the electrical signal. The direction of the electric field may be a direction pointing to light emitting faces of the light-emitting devices 20, as shown by an arrow X in FIG. 3, and may also be a direction opposite to the direction shown by the arrow X in FIG. 3. The barrier structure 30 is controlled to generate the electric field in the direction perpendicular to the plane where the base substrate 10 is located, and the carriers conducted in a direction Y parallel to the plane where the base substrate 10 is located in the light-emitting functional layer 203 can move in a direction X (or a direction opposite to X) under the action of an electric field force of the electric field, so that the carriers in the light-emitting functional layer 203 between the adjacent light-emitting devices 20 are in a depleted state, and the light-emitting functional layer 203 in a corresponding region is in a high resistance state, which blocks the carriers in the light-emitting functional layer 203 from moving the direction Y, crosstalk to adjacent light-emitting devices is avoided, thereby improving the display effect of the display panel.

In the display panel provided by the embodiments of the present disclosure, the barrier structure 30 is arranged between adjacent light-emitting devices 20, and located on a film layer between the light-emitting functional layer 203 and the base substrate 10. By loading the electrical signal to the barrier structure 30, the electric field can be generated in the direction perpendicular to the plane where the base substrate 10 is located. Under the action of the electric field, the carriers in the light-emitting functional layer 203 can move in the direction perpendicular to the plane where the base substrate 10 is located, thereby blocking the carriers in the light-emitting functional layer 203 from moving in the direction parallel to the plane where the base substrate 10 is located, the lateral conductivity of the light-emitting functional layer 203 is reduced, the lateral crosstalk is avoided, and the display effect of the display panel is improved.

Figure 4:
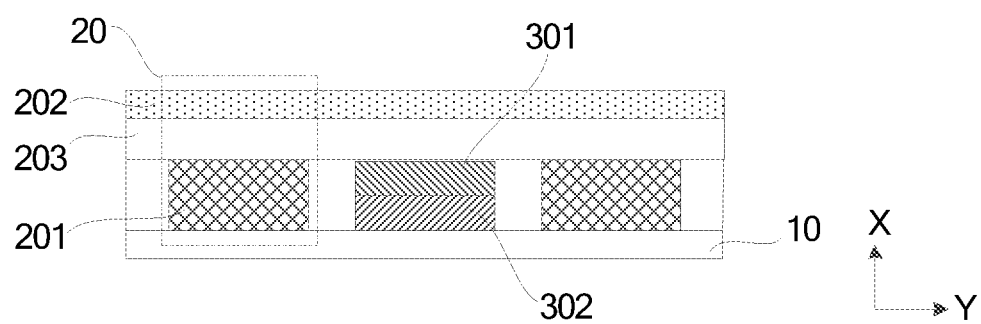
FIG. 4 is another schematic sectional view of a display panel provided by an embodiment of the present disclosure.

FIG. 4 is another schematic sectional view of a display panel provided by an embodiment of the present disclosure. As shown in FIG. 3 and FIG. 4, the barrier structure 30 may include: a dielectric layer 301 and a conductive layer 302 arranged in a stacked manner. The dielectric layer 301 is located between the conductive layer 302 and the light-emitting functional layer 203. By arranging the dielectric layer 301 between the conductive layer 302 and the light-emitting functional layer 203, and a relative dielectric constant of the dielectric layer 301 being usually greater than 1, the electric intensity between the conductive layer 302 and the light-emitting functional layer 203 can be improved, so that the carriers in the light-emitting functional layer 203 at the corresponding position of the barrier structure 30 can be depleted to the greatest extent, the lateral crosstalk is avoided, and the display effect is improved.

With continued reference to FIG. 4, taking the first electrode 201 as an anode as an example. In an organic film layer close to the first electrode 201 in the light-emitting functional layer 203, most carriers are holes, for example, most carriers in the hole transport layer are holes. By applying an electrical signal to the conductive layer 302, the electric field with an electric field direction opposite to the direction X in the figure is generated. The holes can be driven to move towards the dielectric layer 301. The holes can be captured by defects on the surface of the dielectric layer 301 when moving to the surface of the dielectric layer 301, so that the carriers in the light-emitting functional layer 203 at the position between the adjacent light-emitting devices 20 are depleted, and lateral transport of the carriers is blocked.

In an implementation process, the dielectric layer 301 may be made of an inorganic material. For example, a material of the dielectric layer 301 may include at least one of silicon dioxide or silicon nitride. That is, the dielectric layer 301 may be made of silicon dioxide $SiO_2$ or silicon nitride SiN, or doped with $SiO_2$ and SiN, which is not limited here. In addition, the dielectric layer 301 made of the inorganic material can be a relatively thin film layer through a manufacturing process, thereby ensuring a light and thin design of the display panel.

In implementations, in the display panel provided by the embodiments of the present disclosure, as shown in FIG. 3 and FIG. 4, first electrodes 201 of respective light-emitting devices 20 are arranged separately, that is, adjacent first electrodes 201 are separated by a present distance. In the process of practical application, different light-emitting devices 20 can be driven to emit light by applying voltages to different first electrodes 201. Moreover, in order to facilitate control, the light-emitting devices 20 may share the second electrode 202, that is, the second electrode 202 may be arranged as a whole layer.

The conductive layer 302 is arranged on the same layer as at least one film layer in the first electrode 201. In this way, in the manufacturing process, the conductive layer 302 and the at least one film layer in the first electrode 201 can be manufactured by the same patterning process, and the manufacturing steps are saved, so that the manufacturing cost is saved. An orthographic projection of the barrier structure 30 on the base substrate 10 does not overlap an orthographic projection of the first electrode 201 on the base substrate 10. In this way, a short circuit between the barrier structure 30 and the first electrode 201 can be avoided.

In the implementation process, the barrier structure 30 may be arranged between every two adjacent first electrodes 201, or may be arranged between at least part of the two adjacent first electrodes 201. Of course, the barrier structure 30 may be arranged by other modes according to the actual application requirements of the conductivity of the carriers in the light-emitting functional layer 203, which will not be described in detail here.

Figure 5:
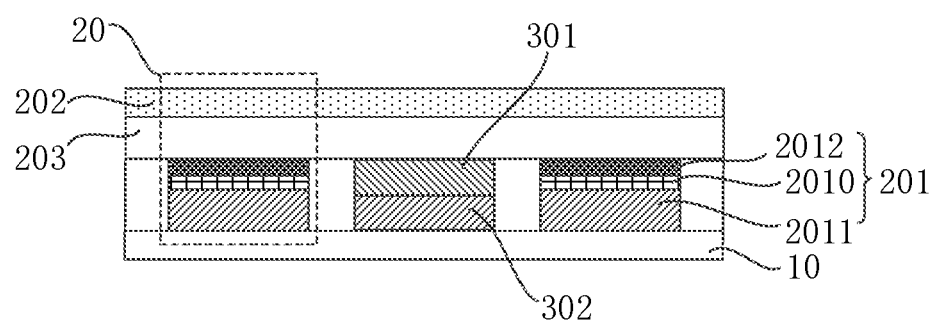
FIG. 5 is yet another schematic sectional view of a display panel provided by an embodiment of the present disclosure.

FIG. 5 is another schematic sectional view of the display panel provided by the embodiments of the present disclosure. As shown in FIG. 5, the first electrode 201 includes a first conductive electrode 2011, a metal reflective layer 2010 and a second conductive electrode 2012 sequentially arranged away from the base substrate 10. The conductive layer 302 is arranged on the same layer as the first conductive electrode 2011. In this way, in the manufacturing process, the conductive layer 302 and the first conductive electrode 2011 may be manufactured by the same patterning process, and the manufacturing steps are saved, so that the manufacturing cost is saved. For example, a conductive film layer is formed on the base substrate 10, and then patterns of the first conductive electrode 2011 and the conductive layer 302 are formed by one-time patterning process. In the implementation, the metal reflective layer 2010 may be a metal thin film, for example, may be a silver thin film or a magnesium thin film.

In addition, due to the small preset distance between the adjacent first electrodes 201, in order to avoid the short circuit between the first electrode 201 and the conductive layer 302, the conductive layer 302 and the first electrode 201 may also be arranged at different layers. For example, the conductive layer 302 may be arranged on a side of the first electrode 201 close to the base substrate 10. Moreover, in order to save the process cost, the conductive layer 302 may also be arranged on the same layer as conductive film layer(s) on the side of the first electrode 201 close to the base substrate 10.

In embodiments of the present disclosure, also referring to FIG. 5, the surface of the side of the dielectric layer 301 close to the light-emitting functional layer 203 has surface defects. For example, the surface of the dielectric layer 301 may be roughened to increase a surface ratio of the surface of the dielectric layer 301, so as to increase a defect amount of the dielectric layer 301, so that the ability of the dielectric layer 301 to capture the carriers is improved, and the blocking effect of the barrier structure 30 on the carriers is enhanced, thereby improving the display effect of the display panel.

In embodiments of the present disclosure, the display panel may further include a power signal line. The power signal line is coupled with the conductive layer, and configured to provide an electrical signal to the conductive layer. In the implementation, one end of the power signal line may be coupled with the conductive layer, the other end of the power signal line may extend to an edge of the display panel and be coupled with a driving chip, so as to provide the electrical signal to the power signal line through the driving chip. That is, the conductive layer may be coupled with the driving chip through the power signal line, and receive the electrical signal from the driving chip. The specific situation of the electrical signal received by the conductive layer may be controlled by the driving chip. For example, the driving chip may output a high-level signal to the conductive layer, or may output a low-level signal to the conductive layer, which is not limited here. Still referring to FIG. 3, when the conductive layer 302 receives the low-level signal from the driving chip, the barrier structure 30 will generate an electric field in a direction opposite to the arrow X. When the conductive layer 302 receives the high-level signal from the driving chip, the barrier structure 30 will generate an electric field in a direction shown by the arrow X.

Figure 6:
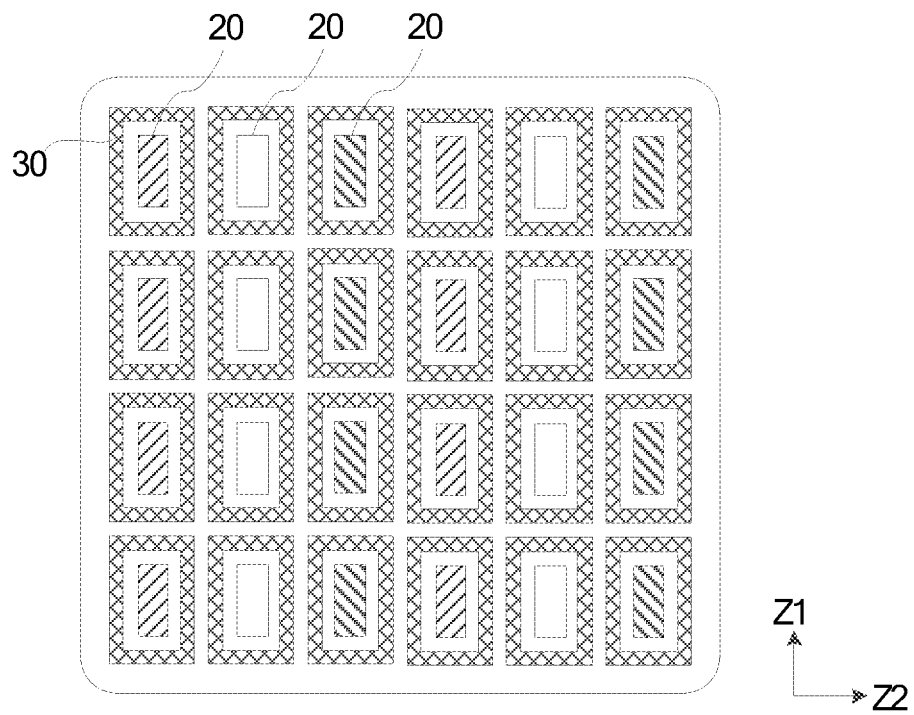
FIG. 6 is a schematic top view of a display panel provided by an embodiment of the present disclosure.

FIG. 6 is a schematic top view of the display panel provided by an embodiment of the present disclosure. As shown in FIG. 6, the barrier structure 30 is a ring-shaped structure surrounding the light-emitting device 20. For example, in FIG. 6, each barrier structure 30 surrounds a respective one light-emitting device 20, and for each light-emitting device 20 in the display panel, a respective one barrier structure 30 surrounds the each light-emitting device 20. Of course, the barrier structures 30 may also be arranged around part of the light-emitting devices 20, which is not limited here. Alternately, the barrier structure 30 may also be arranged to surround two or more light-emitting devices 20, and the quantity of the light-emitting devices 20 surrounded by one barrier structure 30 is not limited here. In practical application, the barrier structures 30 may be correspondingly arranged according to the distribution of the carriers of the light-emitting functional layer in different regions, which is not limited here. In addition, in FIG. 6, the barrier structure 30 is illustrated as an example of a ring-shaped structure. In the implementation, the barrier structure 30 may also be arranged as a non-ring-shaped structure such as a strip or semi-surrounded structure, which is not limited here.

Figure 7:
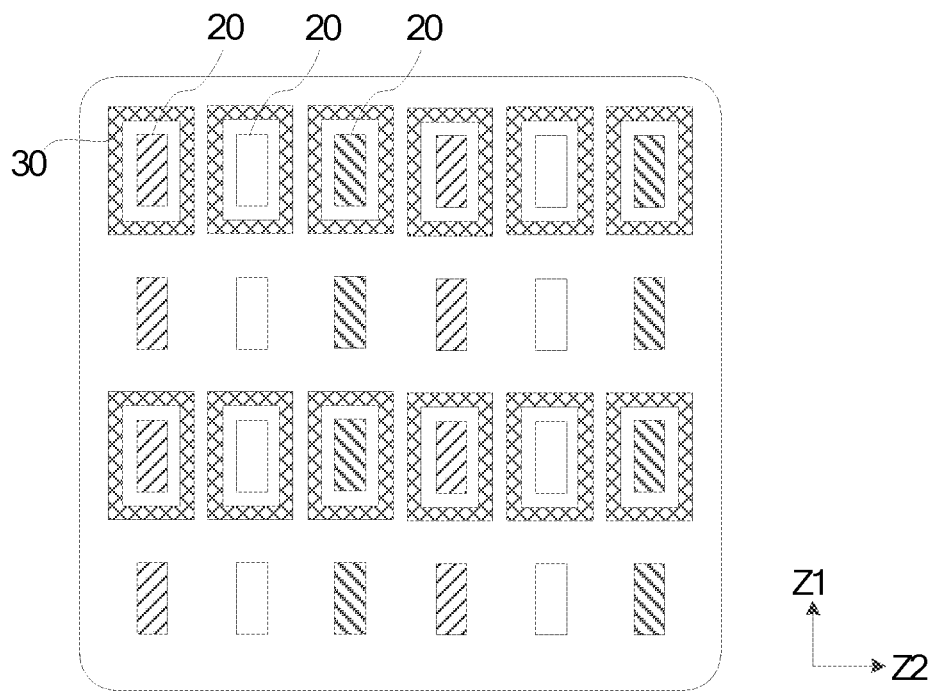
FIG. 7 is another schematic top view of a display panel provided by an embodiment of the present disclosure.

FIG. 7 is yet another schematic top view of the display panel provided by an embodiment of the present disclosure. As shown in FIG. 7, in the embodiment of the present disclosure, the plurality of light-emitting devices 20 are arranged in an array in a first direction Z1 and a second direction Z2, and the first direction Z1 and the second direction Z2 intersect with each other. In the first direction Z1, two adjacent barrier structures 30 are separated by at least one light-emitting device 20. The barrier structure 30 is arranged around the light-emitting device 20, the lateral crosstalk between the two adjacent light-emitting devices 20 can be prevented. Therefore, the barrier structure 30 is arranged around one of the two adjacent light-emitting devices 20, the lateral crosstalk between the two light-emitting devices 20 can be prevented. Therefore, in the embodiment of the present disclosure, in the first direction Z1, the two adjacent barrier structures 30 are separated by at least one light-emitting device 20. The quantity of the barrier structures 30 in the display panel can be reduced under the condition of effectively avoiding lateral crosstalk between the light-emitting devices 20.

The display panel in the embodiments of the present disclosure may further include a plurality of data lines and a plurality of grid lines. An extending direction of the data lines and an extending direction of the gate lines intersect with each other. The first direction Z1 may be a direction extending along the data lines, and the second direction Z2 may be a direction extending along the grid lines.

With continued reference to FIG. 7, in the embodiment of the present disclosure, in the first direction Z1, the two adjacent barrier structures 30 are separated by at least one light-emitting device 20. In one row of light-emitting devices 20 arranged in the second direction Z2, each light-emitting device 20 is surrounded by a respective one barrier structure 30. In FIG. 7, the situation that the two adjacent barrier structures 30 in the first direction Z1 are separated by one light-emitting device 20 is taken as an example. In this way, lateral crosstalk between each light-emitting device 20 and other light-emitting devices 20 can be avoided. Moreover, compared with a structure shown in FIG. 6, the quantity of the barrier structures 30 in the display panel can be reduced by half. In addition, in the implementation process, the barrier structure 30 is not arranged around the light-emitting devices 20 parallel to the second direction Z2 and close to the display panel, and a narrow bezel design of the display panel is also facilitated.

Figure 8:
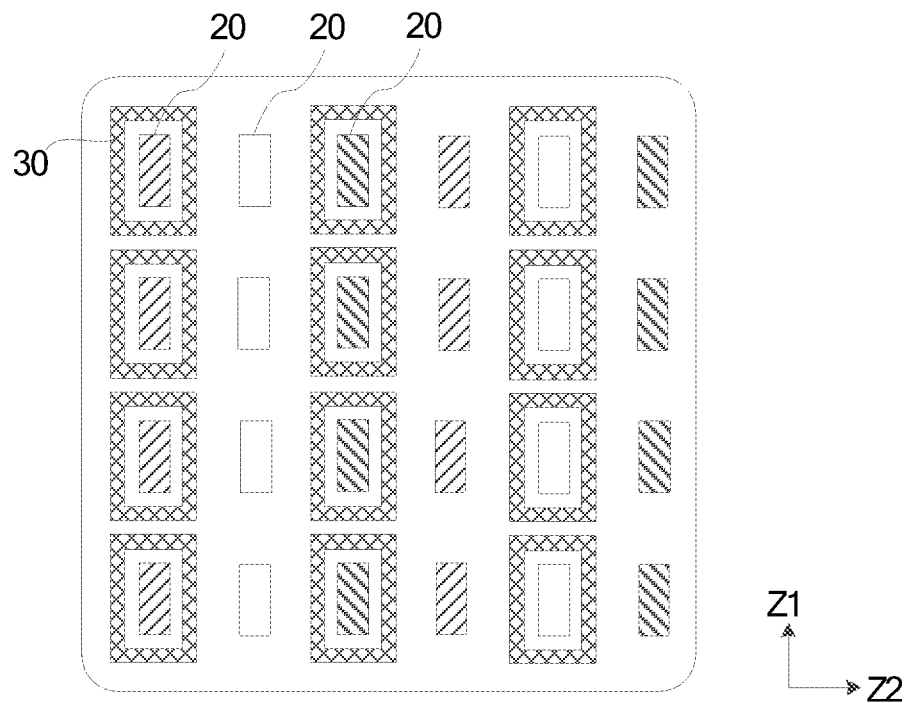
FIG. 8 is yet another top view of a display panel provided by an embodiment of the present disclosure.

FIG. 8 is yet another schematic top view of the display panel provided by an embodiment of the present disclosure. As shown in FIG. 8, in the embodiment of the present disclosure, it may also be arranged as: in the second direction Z2, the adjacent barrier structures 30 are separated by at least one light-emitting device 20, and in one column of light-emitting devices 20 arranged in the first direction Z1, each light-emitting device 20 is surrounded by a respective one barrier structure 30. Moreover, in the implementation process, the barrier structure 30 may also be not arranged around the light-emitting devices 20 parallel to the first direction Z1 and close to the edge of the display panel, and the narrow bezel design of the display panel is facilitated.

Figure 9:
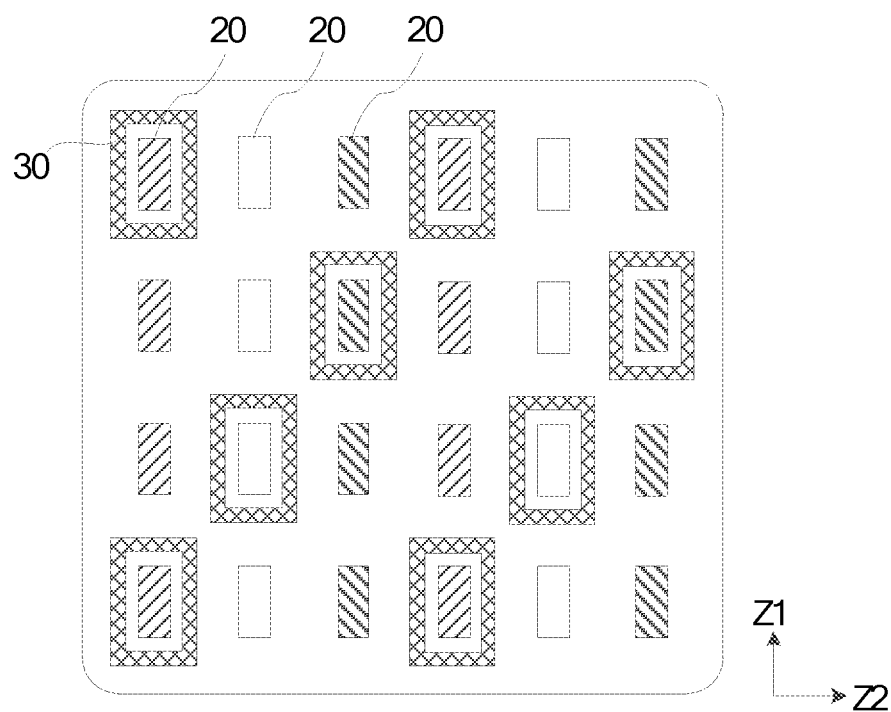
FIG. 9 is yet another top view of a display panel provided by an embodiment of the present disclosure.

FIG. 9 is yet another schematic top view of the display panel provided by an embodiment of the present disclosure. As shown in FIG. 9, in the embodiment of the present disclosure, in the first direction Z1, the two adjacent barrier structures 30 are separated by at least one light-emitting device 20, and in the second direction Z2, the two adjacent barrier structures 30 are separated by at least one light-emitting device 20. In this way, on the basis of effectively reducing the lateral crosstalk between the light-emitting devices 20, the quantity of the barrier structures 30 in the display panel is less. Moreover, a size of a gap between the adjacent light-emitting devices 20 is generally small, this arrangement can prevent the arrangement of two barrier structures 30 in the same gap, thereby avoiding the short circuit between the two barrier structures 30.

Figure 10:
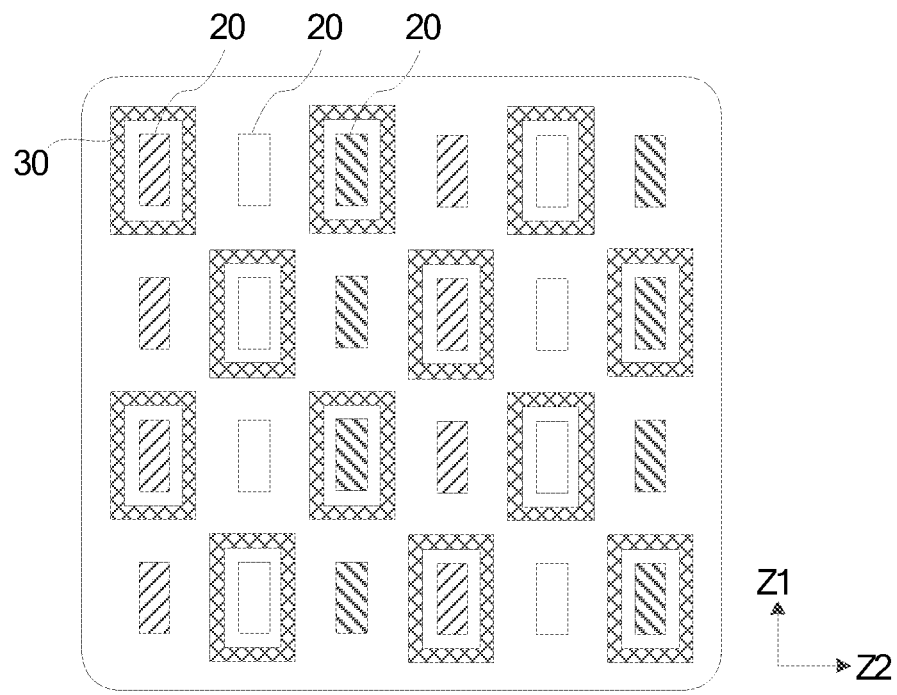
FIG. 10 is yet another schematic top view of a display panel provided by an embodiment of the present disclosure.

In FIG. 9, the situation that in the first direction Z1, two adjacent barrier structures 30 are separated by two light-emitting devices 20, and in the second direction Z2, two adjacent barrier structures 30 are separated by two light-emitting devices 20 is taken as an example for illustration. In the implementation, in the first direction Z1 (or the second direction Z2), two adjacent barrier structures 30 may also be separated by the light-emitting devices 20 of other quantities, which is not limited here. FIG. 10 is yet another schematic top view of the display panel provided by an embodiment of the present disclosure. For example, in FIG. 10, in the first direction Z1, two adjacent barrier structures 30 are separated by one light-emitting device 20, and in the second direction Z2, two adjacent barrier structures 30 are separated by one light-emitting device 20. In the implementation process, in the structure shown in FIG. 9 and FIG. 10, in the first direction Z1 and the second direction Z2, a barrier structure 30 is arranged at an interval of one (or two) light-emitting device(s) 20 respectively. On one hand, the manufacturing process cost can be reduced; one the other hand, the two adjacent light-emitting devices 20 share the same barrier structure 30, it is ensured that the carriers in each light-emitting functional layer in the display panel are uniformly removed, so that full blocking of a lateral electric field between the two adjacent first electrodes is ensured, and the display effect is improved. In addition, the light and thin design of the display panel is taken into account.

Of course, in the implementation process, the barrier structures may be arranged according to the mode shown in any one of FIGS. 6-10, but is not limited to the above modes. In addition to the above several arrangement modes, the barrier structures may further be arranged in other modes according to the actual application requirements, which will not be described in detail here.

Figure 11:
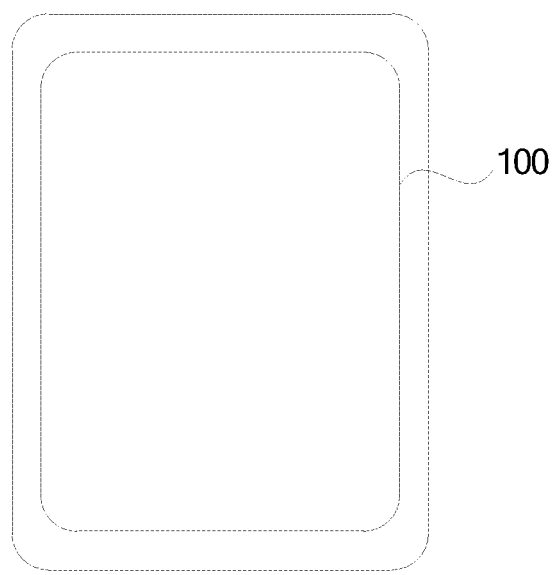
FIG. 11 is a schematic top view of a display apparatus provided by an embodiment of the present disclosure.

Based on the same inventive concept, embodiments of the present disclosure further provide a display apparatus. FIG. 11 is a schematic top view of the display apparatus provided by an embodiment of the present disclosure. As shown in FIG. 11, the display apparatus includes the above any display panel 100 provided by the embodiments of the present disclosure.

In the implementation, the display apparatus may be any products or components with display functions such as a mobile phone (as shown in FIG. 11), a tablet computer, a television, a monitor, a notebook computer, a digital photo frame, a navigator and a watch. The implementation of the display apparatus may refer to the implementation of the above display panel, and the repetition will not be repeated.

Based on the same inventive concept, embodiments of the present disclosure further provide a driving method for the display panel. FIG. 12 is a flow chart of a driving method for a display panel provided by the embodiment of the present disclosure. As shown in FIG. 12, the driving method provided by the embodiments of the present disclosure may include the following steps.

S101, an electrical signal is loaded to a barrier structure, so as to control the barrier structure to generate an electric field in a direction perpendicular to a plane where a base substrate is located, so that carriers in a light-emitting functional layer move in the direction perpendicular to the plane where the base substrate is located under an action of the electric field.

In the implementation process, the electrical signal may be loaded to a power signal line through a driving chip, so as to load the electrical signal to the barrier structure. The loaded electrical signal may be a high-level signal, or a low-level signal, which is not limited here. Accordingly, the electric field generated by the barrier structure is formed according to the specific situation of the loaded electrical signal. The electric field direction mainly depends on a specific value of the loaded electrical signal, which may be a direction pointing to a light emitting face of the display panel, or a direction facing away from the light emitting face of the display panel, which is not limited here.

In the embodiments of the present disclosure, under the action of the electric field generated by the barrier structure, the carriers in the light-emitting functional layer are driven to move in a direction perpendicular to a plane where the base substrate is located, thereby blocking lateral movement of the carriers in the light-emitting functional layer, avoiding lateral crosstalk, and improving the display effect of the display panel.

Those skilled in the art will appreciate that embodiments of the present application may be provided as methods, systems or computer program products. Therefore, the present application may take the form of full hardware embodiments, full software embodiments, or embodiments combining software and hardware aspects. Further, the present application may take the form of computer program products implemented on one or more computer usable storage media (including but not limited to a disk memory, a CD-ROM, an optical memory, etc.) containing computer usable program codes.

The present application is described with reference to flow charts and/or block diagrams of methods, equipment (systems) and computer program products according to the present application. It should be understood that each flow and/or block in the flow charts and/or block diagrams and the combination of flows and/or blocks in the flow charts and/or block diagram can be realized by computer program instructions. These computer program instructions may be provided to a processor of a general-purpose computer, a special-purpose computer, an embedded processor or other programmable data processing equipment to generate a machine, so that an apparatus for realizing functions specified in one or more flows of the flow charts and/or one or more blocks of the block diagrams is generated by the instructions executed by the processor of a computer or other programmable data processing equipment.

These computer instructions may also be stored in a computer-readable memory that can guide a computer or other programmable data processing equipment to work in a specific mode, so that the instructions stored in the computer-readable memory generate a manufactured product including an instruction apparatus, and the instruction apparatus realizes the functions specified in one or more flows of the flow charts and/or one or more blocks of the block diagrams.

These computer program instructions may also be loaded on a computer or other programmable data processing equipment, so that a series of operation steps are executed on the computer or other programmable equipment to generate computer implemented processing. Therefore, the instructions executed on the computer or other programmable equipment provide steps for realizing the functions specified in one or more flows of the flow charts and/or one or more blocks of the block diagrams.

Obviously, those skilled in the art can make various modifications and variations to the present application without departing from the spirit and scope of the present application. As such, provided that these modifications and variations of the present application fall within the scope of the claims of the present application and their equivalents, the present application is also intended to cover such modifications and variations.

What is claimed is:

1. A display panel, comprising:
   a base substrate; wherein the base substrate is a silicon substrate;
   a plurality of light-emitting devices on the base substrate, wherein the light-emitting device comprises:
      a first electrode and a second electrode arranged in a stacked manner, and
      a light-emitting functional layer between the first electrode and the second electrode; and
   barrier structures on a film layer between the light-emitting functional layer and the base substrate; wherein the barrier structure comprises a dielectric layer and a conductive layer arranged in a stacked manner, the dielectric layer is in contact with the light-emitting functional layer, a surface of a side of the dielectric layer close to the light-emitting functional layer is a rough surface, the first electrode is in contact with a surface of a side of the base substrate close to the light-emitting functional layer, the barrier structures are arranged on the side of the base substrate close to the light-emitting functional layer, an orthographic projection of the barrier structure on the base substrate is between orthographic projections of light-emitting devices, adjacent to the barrier structure, on the base substrate, and the orthographic projection of the barrier structure on the base substrate dose not overlap an orthographic projection of the first electrode on the base substrate;
   wherein the barrier structure is configured to generate, under control of an electrical signal, an electric field in a direction perpendicular to a plane where the base substrate is located.

2. The display panel according to claim 1, wherein the dielectric layer is located between the conductive layer and the light-emitting functional layer.

3. The display panel according to claim 2, wherein:
   the first electrodes of the plurality of light-emitting devices are arranged separately;
   the conductive layer is arranged on a same layer as at least one film layer in the first electrode.

4. The display panel according to claim 3, wherein the first electrode comprises:
   a first conductive electrode, a metal reflective layer and a second conductive electrode sequentially away from the base substrate;
   wherein the conductive layer is arranged on a same layer as the first conductive electrode.

5. The display panel according to claim 2, wherein a material of the dielectric layer comprises at least one of silicon dioxide or silicon nitride.

6. The display panel according to claim 1, wherein the barrier structure is a ring-shaped structure surrounding the light-emitting device.

7. The display panel according to claim 6, wherein each of the barrier structures surrounds a respective one of the plurality of light-emitting devices, and each of the plurality of light-emitting devices in the display panel is surrounded by a respective one of the barrier structures.

8. The display panel according to claim 6, wherein the plurality of light-emitting devices are arranged in an array in a first direction and a second direction, and the first direction and the second direction intersect with each other; and
   in the first direction, two adjacent barrier structures are separated by at least one light-emitting device.

9. The display panel according to claim 8, wherein each light-emitting device, in a row of light-emitting devices arranged in the second direction, is surrounded by a respective one of the barrier structures.

10. The display panel according to claim 8, wherein in the second direction, two adjacent barrier structures are separated by at least one light-emitting device.

11. The display panel according to claim 1, further comprising:
    a power signal line;
    wherein the power signal line is coupled with the conductive layer, and configured to provide the electrical signal to the conductive layer.

12. A display apparatus, comprising: the display panel according to claim 1.

13. A driving method for the display panel according to claim 1, comprising:
    loading the electrical signal to the barrier structure, so as to control the barrier structure to generate the electric field in the direction perpendicular to the plane where the base substrate is located, so that carriers in the light-emitting functional layer move in the direction perpendicular to the plane where the base substrate is located under an action of the electric field.

* * * * *